United States Patent
Ogi

(10) Patent No.: US 8,140,181 B2
(45) Date of Patent: Mar. 20, 2012

(54) SUBSTRATE TRANSFER METHOD, CONTROL PROGRAM, AND STORAGE MEDIUM STORING SAME

(75) Inventor: Tatsuya Ogi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 59 days.

(21) Appl. No.: 12/575,930

(22) Filed: Oct. 8, 2009

(65) Prior Publication Data
US 2010/0094452 A1   Apr. 15, 2010

(30) Foreign Application Priority Data
Oct. 10, 2008 (JP) .................. 2008-263659

(51) Int. Cl.
*G06F 7/00* (2006.01)

(52) U.S. Cl. ..................................... 700/214

(58) Field of Classification Search .......... 700/214; 414/222.12, 222.02, 936
See application file for complete search history.

(56) References Cited

U.S. PATENT DOCUMENTS

| | | | |
|---|---|---|---|
| 6,845,292 B2 * | 1/2005 | Sha et al. | 700/218 |
| 2004/0168633 A1 | 9/2004 | Nozawa et al. | |
| 2005/0016818 A1 * | 1/2005 | Ito et al. | 198/345.1 |
| 2005/0076818 A1 * | 4/2005 | Grimm et al. | 111/119 |
| 2008/0187413 A1 * | 8/2008 | Kondoh | 414/217 |
| 2008/0187416 A1 * | 8/2008 | Hiroki et al. | 414/222.02 |
| 2008/0223298 A1 * | 9/2008 | Shimizu | 118/663 |
| 2009/0169344 A1 | 7/2009 | Nozawa et al. | |
| 2009/0252580 A1 * | 10/2009 | Takizawa et al. | 414/222.02 |

FOREIGN PATENT DOCUMENTS

JP    2004-282002    10/2004

* cited by examiner

*Primary Examiner* — Ramya Burgess
(74) *Attorney, Agent, or Firm* — Oblon, Spivak, McClelland, Maier & Neustadt, L.L.P.

(57) ABSTRACT

A substrate transfer method for use in a substrate processing apparatus including a first processing unit that performs a first process on a substrate, a second processing unit performing a second process on the substrate, and a substrate transfer mechanism that transfers the substrate between the first and the second processing unit, includes: detecting misalignment of the substrate when the substrate is unloaded from the first processing unit; and correcting the misalignment of the substrate based on a detected result. Further, the substrate transfer method includes loading the misalignment-corrected substrate to a targeted position in the second processing unit.

6 Claims, 6 Drawing Sheets

SUBSTRATE TRANSFER METHOD, CONTROL PROGRAM, AND STORAGE MEDIUM STORING SAME

CROSS-REFERENCE TO RELATED APPLICATIONS

This application claims the benefit of priority to Japanese Patent Application No. 2008-263659, filed on Oct. 10, 2008, the entire contents of which are incorporated herein by reference.

FIELD OF THE INVENTION

The present invention relates to a substrate transfer method, a control program, and a storage medium; and more particularly, to a substrate transfer method for use in a substrate processing apparatus that consecutively performs a plurality of processes on a substrate.

BACKGROUND OF THE INVENTION

To perform various treatments, such as film forming, etching and the like, on a semiconductor wafer which serves as a substrate, a substrate processing apparatus generally includes a plurality of processing modules (hereinafter, referred to as "PMs"), each of which can accommodate the wafer to conduct a predetermined process thereon; a wafer cassette mounting table mounting thereon a wafer cassette serving as an airtight container storing therein predetermined sheets of wafers; and transfer arms arranged as a substrate transfer mechanism between the PMs and the wafer cassette mounting table. The transfer arm transfers a wafer among the PMs, load lock module, and the wafer cassette mounting table.

In a substrate processing apparatus performing a plurality of processes on a wafer in which the wafer is transferred between various processing units, such as PMs, load lock module, or the like, it becomes difficult to precisely perform a process on the wafer if a relative misalignment occurs while the wafer is being transferred. Accordingly, the relative misalignment of the wafer needs to be prevented or corrected when transferring the wafer in the substrate processing apparatus that performs a plurality of processes on the wafer.

To prevent such a relative misalignment of the wafer, the substrate processing apparatus generally is provided with a pre-alignment unit conducting a positional alignment of the wafer before loading the wafer into the processing units. As a target to be processed, the wafer is position-aligned by the pre-alignment unit before being transferred to the processing units by the transfer arm. The transferred wafer is subjected to a predetermined process by each processing unit.

In order to achieve a precise position alignment of the wafer in a series of treatment processes, however, the wafer previously subjected to a first treatment in a first PM needs to be subjected to a position alignment again before being loaded into a next PM for the subsequent process. To this end, there has been developed a technology for misalignment correction in which a wafer sensor is installed at a predetermined position in a wafer transfer path to detect misalignment of the wafer passing by the sensor. The detected wafer is subjected to a misalignment correction process before being loaded into the next PM for the subsequent process.

Since the wafer is subjected to the misalignment correction process before being loaded into the next PM for the subsequent process, the technology does not require a feedback control for the purpose of misalignment correction when the wafer is loaded into the PM for the next process. However, the wafer needs to be returned to the position where the wafer sensor is installed in the transfer path whenever the wafer is loaded into a PM for subsequent process. This makes the operation cumbersome. For this reason, a wafer transfer method has been suggested in which the misalignment of the wafer is detected and corrected when the wafer unloaded from a first PM performing a certain treatment is loaded into a next PM performing another treatment.

For example, Japanese Patent Laid-open Application No. 2004-282002 discloses such a misalignment correction method, wherein the center of the wafer is monitored when a wafer unloaded from a processing chamber (chamber) of a PM is loaded into a chamber of a next PM, and the wafer is subjected to a misalignment correction process when being mounted on a substrate mounting table provided in the chamber of the next PM.

However, in the above-described prior art, in which the misalignment of a wafer is detected and then corrected by feedback control when the wafer is loaded into the processing chamber of the next PM, the misalignment correction is carried out immediately before reaching a destination position. Therefore it is difficult to secure a sufficient correction control time. Further in the prior art, further, the wafer once transferred to the destination position or its proximity needs to be accurately adjusted before being moved to a targeted position after correction, and this makes the operation cumbersome. Further, when the wafer is loaded into the chamber of the next PM, an arm of a transfer mechanism is generally in a fully extended state. Accordingly, if the misalignment correction is performed in such a state, it becomes difficult to achieve an accurate position alignment, thus making it difficult to accurately fulfill the position correction.

SUMMARY OF THE INVENTION

In view of the above, the present invention provides a substrate transfer method, a control program, and a storage medium capable of efficiently correcting the misalignment of a substrate to accurately transfer the substrate to a targeted position, without suffering from complicated control.

In accordance with a first aspect of the present invention, there is provided a substrate transfer method for use in a substrate processing apparatus including a first processing unit that performs a first process on a substrate, a second processing unit performing a second process on the substrate, and a substrate transfer mechanism that transfers the substrate between the first and the second processing unit, the method including: detecting misalignment of the substrate when the substrate is unloaded from the first processing unit; correcting the misalignment of the substrate based on a detected result; and loading the misalignment-corrected substrate to a targeted position in the second processing unit.

In accordance with a second aspect of the present invention, there is provided a control program allowing a computer to execute a substrate transfer method for use in a substrate processing apparatus including a first processing unit that performs a first process on a substrate, a second processing unit performing a second process on the substrate, and a substrate transfer mechanism that transfers the substrate between the first processing unit and the second processing unit, the method including: detecting misalignment of the substrate when the substrate is unloaded from the first processing unit; correcting the misalignment of the substrate based on a detected result; and loading the misalignment-corrected substrate to a targeted position in the second processing unit.

In accordance with a third aspect of the present invention, there is provided a storage medium readable by a computer, the storage medium storing the control program described above.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENT

Hereinafter, embodiments of the present invention will be described in detail with reference to accompanying drawings which form a part hereof.

First of all, there will be described a substrate processing apparatus performing a substrate transfer method in accordance with an embodiment of the present invention. The substrate processing apparatus includes a plurality of processing modules, each of which performs an etching process, ashing process or the like on a wafer W serving as a substrate to be processed by using a plasma.

Figure 1:
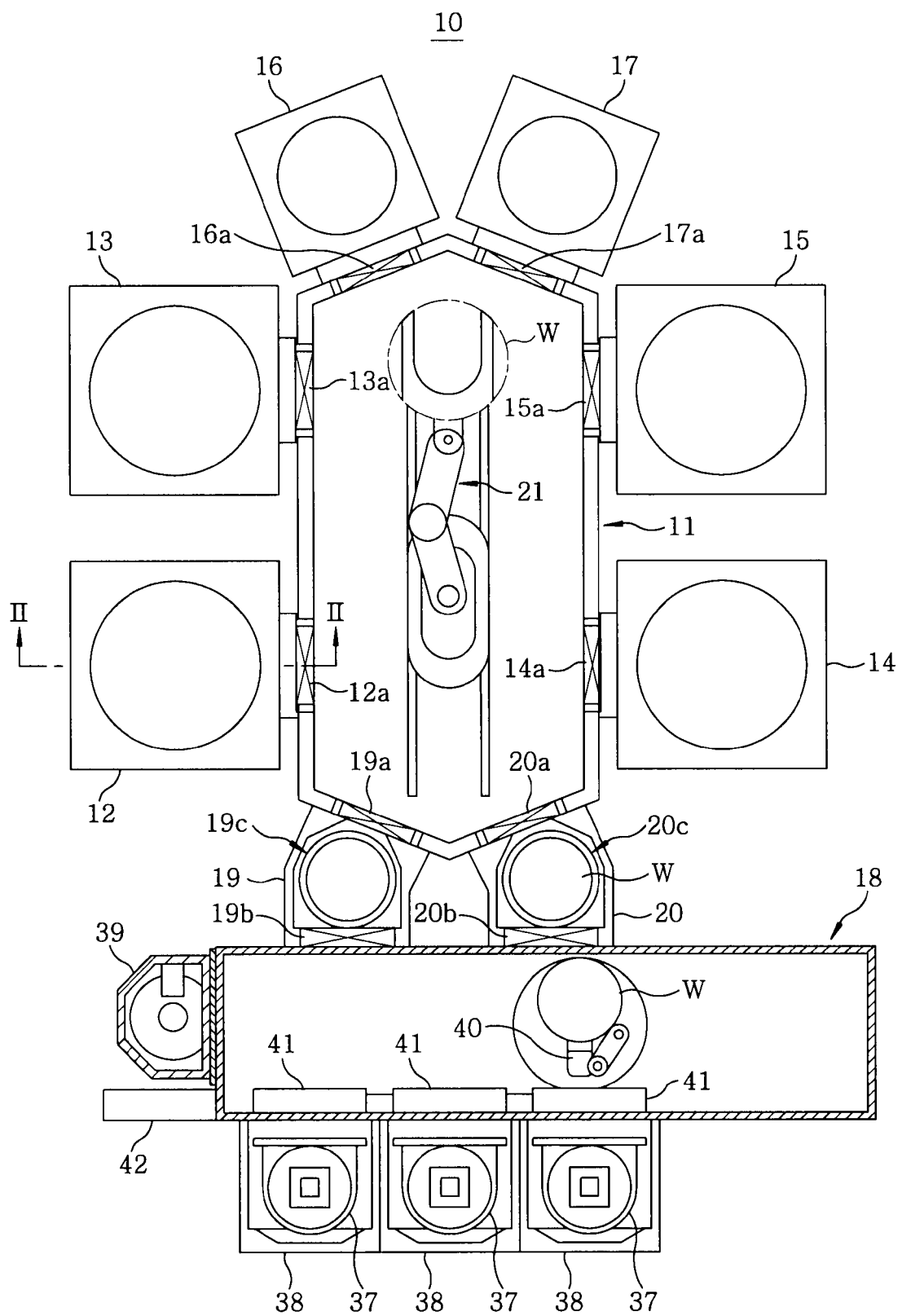
FIG. 1 is a plan view schematically illustrating a configuration of a substrate processing apparatus performing a substrate transfer method in accordance with an embodiment of the present invention.

FIG. 1 is a plan view schematically illustrating a configuration of a substrate processing apparatus performing a substrate transfer method in accordance with the embodiment of the present invention.

Referring to FIG. 1, the substrate processing apparatus 10 is a cluster-type substrate processing apparatus, which includes a transfer module 11 having a hexagonal shape in a plan view; two PMs 12 and 13 connected to a side surface of the transfer module 11; two PMs 14 and 15 connected to another side surface of the transfer module 11 opposite to the PMs 12 and 13; a PM 16 connected to the transfer module 11 to be adjacent to the PM 13; a PM 17 connected to the transfer module 11 to be adjacent to the PM 15; a loader module 18 that is a rectangular transfer chamber; and two load lock modules 19 and 20 that are arranged between the transfer module 11 and the loader module 18 and connect the transfer module 11 and the loader module 18 to each other.

The transfer module 11 has therein a transfer arm 21 that is freely contractible/extensible and revolvable. The transfer arm 21 transfers a wafer W among the PMs 12 to 17 and load lock modules 19 and 20.

The PM 12 has a processing chamber accommodating therein the wafer W. While a processing gas is introduced into the chamber, an electric field is created in the chamber to generate a plasma. The wafer W is etched using the plasma.

Figure 2:
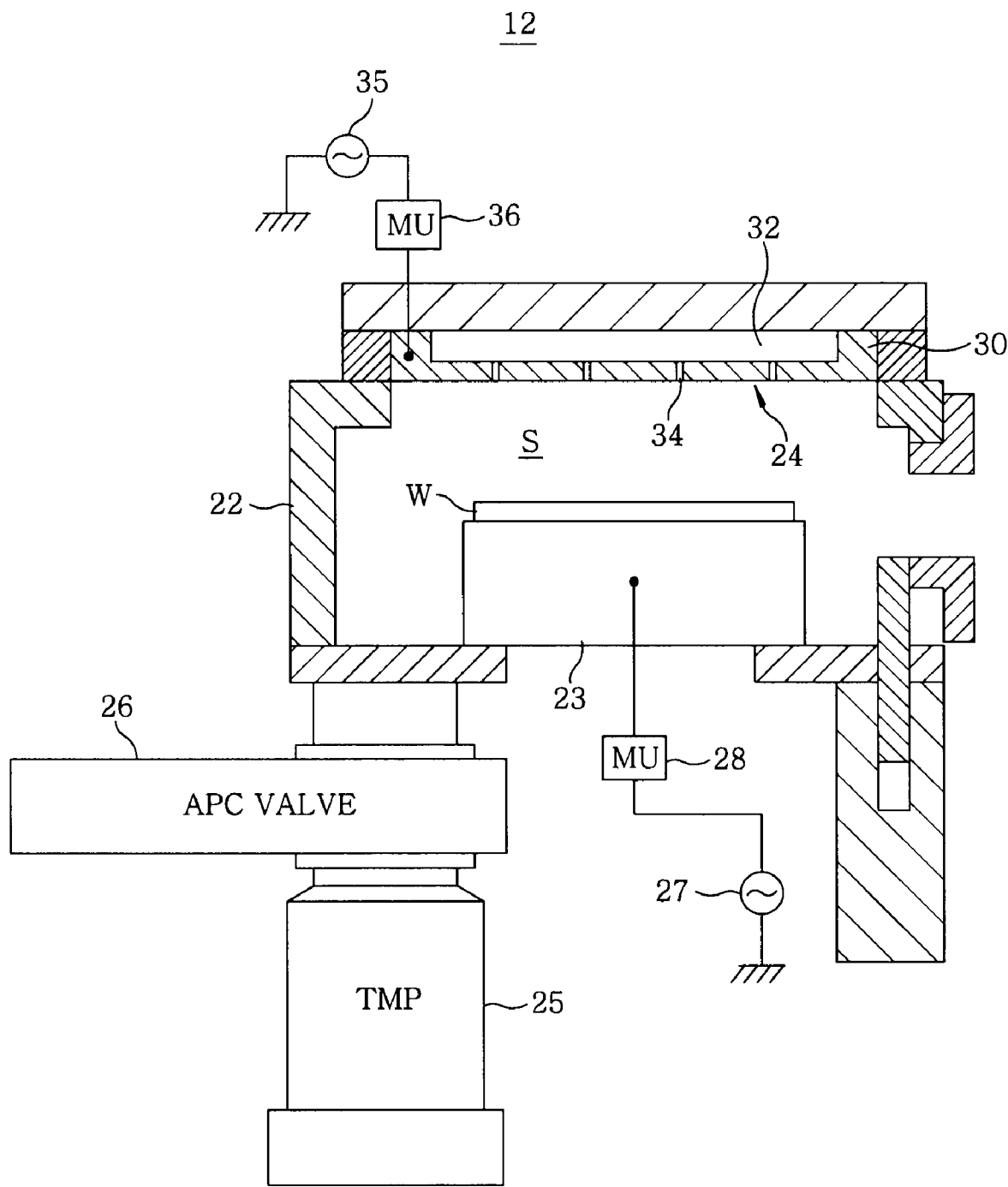
FIG. 2 is a cross sectional view taken along the line II-II shown in FIG. 1.

FIG. 2 is a cross sectional view taken along the line II-II shown in FIG. 1.

Referring to FIG. 2, the processing module 12 includes the processing chamber 22, a mounting table 23 arranged in the chamber 22 to mount thereon the wafer W, a shower head 24 arranged in an upper part of the chamber 22 to face the mounting table 23, a turbo molecular pump (TMP) 25 that exhausts a gas or the like from the chamber 22, and an adaptive pressure control (APC) valve 26, which is a variable butterfly valve arranged between the chamber 22 and the TMP 25 to control the pressure in the chamber 22.

A high frequency power supply 27 is connected to the mounting table 23 via a matching unit (MU) 28, and supplies a high frequency electric power to the mounting table 23. Accordingly, the mounting table 23 serves as a lower electrode. Further, the matching unit 28 reduces reflection of the high frequency electric power from the mounting table to maximize efficiency of supplying the high frequency electric power to the mounting table 23. The mounting table 23 applies the high frequency electric power supplied from the high frequency power supply 27 to a processing space S.

The shower head 24 includes a gas supply unit 30 that is shaped as a circular plate. The gas supply unit 30 includes a buffer chamber 32. The buffer chamber 32 communicates with the interior of the chamber 22 via gas vent holes 34. The buffer chamber 32 is connected to a processing gas supply system (not shown).

A high frequency power supply 35 is connected to the shower head 24 via a matching unit (MU) 36, and supplies a high frequency electric power to the shower head 24. Accordingly, the shower head 24 serves as an upper electrode. Further, the matching unit 36 has the same function as that of the matching unit 28. The shower head 24 applies the high frequency electric power supplied from the high frequency power supply 35 to the processing space S.

In the chamber 22 of the PM 12, the high frequency electric powers are applied to the processing space S by the mounting table 23 and the shower head 24 as described above, so that the processing gas supplied through the shower head 24 to the processing space S is converted to a high-density plasma, thus generating ions and radicals. As a result, a predetermined process is performed on the wafer W.

Further, each of the PMs 13 to 17 has the same configuration as that of the PM 12 and performs one of various treatments on the wafer W by using a plasma.

Returning to FIG. 1, the interior of each of the transfer module 11 and the PMs 12 to 17 is maintained at a depressurized state. The transfer module 11 is connected to the PMs 12 to 17 via vacuum gate valves 12a to 17a, respectively.

In the substrate processing apparatus 10, the interior of the loader module 18 is maintained at the atmospheric pressure, while the interior of the transfer module 11 is maintained at vacuum. For this reason, the load lock modules 19 and 20 have vacuum gate valves 19a and 20a, respectively, at positions where the load lock modules 19 and 20 are connected to the transfer module 11, and atmospheric door valves 19b and 20b, respectively, at positions where the load lock modules 19 and 20 are connected to the loader module 18. Accordingly, the load lock modules 19 and 20 are configured as vacuum preliminary transfer chambers that may control the pressure therein. Further, the load lock modules 19 and 20 include wafer mounting tables 19c and 20c, respectively, which temporarily mount the wafer W loaded/unloaded between the load module 18 and the transfer module 11.

In addition to connection to the load lock modules 19 and 20, the load module 18 is connected to, for example, three FOUP (Front Opening Unified Pod) mounting tables 38, each mounting a FOUP 37 as a vessel for receiving, e.g., twenty five sheets of wafers W, and an orienter 39 that pre-aligns the position of the wafer W unloaded from the FOUP 37.

The load lock modules 19 and 20 are connected to a sidewall of the loader module 18 that runs in a length direction thereof, and arranged opposite to the three FOUP mounting tables 38, with the loader module 18 located therebetween. The orienter 39 is arranged at an end side in the length direction of the loader module 18.

The loader module 18 includes therein a scalar dual-arm type transfer arm 40 that transfers the wafer W, and three loading ports 41 that are arranged on an inner wall to face the FOUP mounting tables 38, respectively, and serve as input ports of the wafer W. The transfer arm 40 withdraws the wafer W from the FOUP 37 mounted on the FOUP mounting table 38 via the loading port 41 and transfers the withdrawn wafer W between the load lock modules 19 and 20 and the orienter 39.

Further, the substrate processing apparatus 10 includes an operational panel 42 that is arranged at the end side of the length direction of the loader module 18. The operational panel 42 includes a display unit that is configured as, for example, a liquid crystal display (LCD), and displays operational conditions of each component included in the substrate processing apparatus 10.

Figure 3:
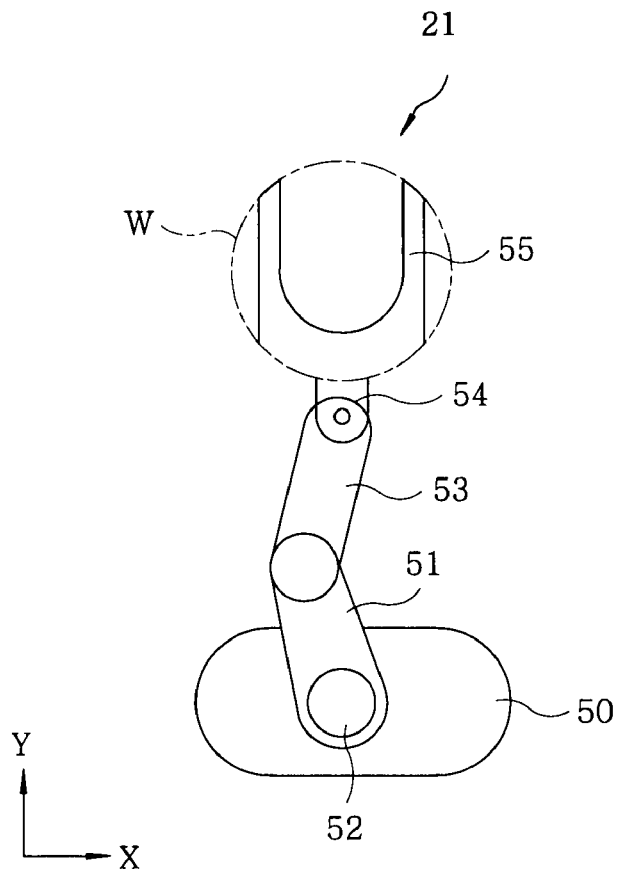
FIG. 3 is a plan view schematically illustrating a transfer arm shown in FIG. 1.
Figure 4:
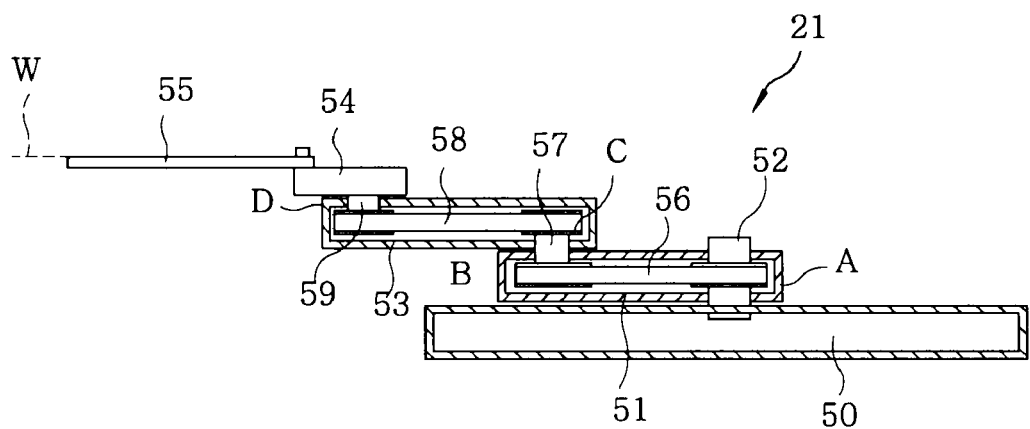
FIG. 4 is a cross sectional view of the transfer arm shown in FIG. 3.

FIG. 3 is a plan view schematically illustrating a configuration of the transfer arm 21 shown in FIG. 1, and FIG. 4 is a cross sectional view of the transfer arm 21 shown in FIG. 3.

Referring to FIG. 3, the transfer arm 21, which is a single-axis multi-joint robot, includes a support base 50, a first arm 51 provided at the support base 50 to be freely rotatable by a motor 52, a second arm 53 one end of which is connected to the first arm 51 and the other end thereof is connected to a support plate 54, and a pair of wafer picks 55 holding the wafer W against the support plate 54. To hold the wafer W, for example, a plurality of adsorption pads (not shown) are provided at the wafer picks 55.

Referring to FIG. 4, a pulley A fixed at a rotation shaft of the motor 52 is provided at the first arm 51 so that the rotational force of the motor is transferred to a pulley B via a belt 56. The rotational force of the pulley B is transferred to a pulley C fixed at the second arm 53 via a shaft member 57, and the rotational force of the pulley C is transferred to a pulley D via a belt 58. The rotational force of the pulley D is transferred to the support plate 54 fixed at a shaft member 59 via the shaft member 59 to move back and forth the wafer picks 55 in an XY direction.

A position relationship between the transfer arm 21 and the chamber 22 of the PM 12 as shown in FIG. 1 will be described hereinafter.

Figure 5:
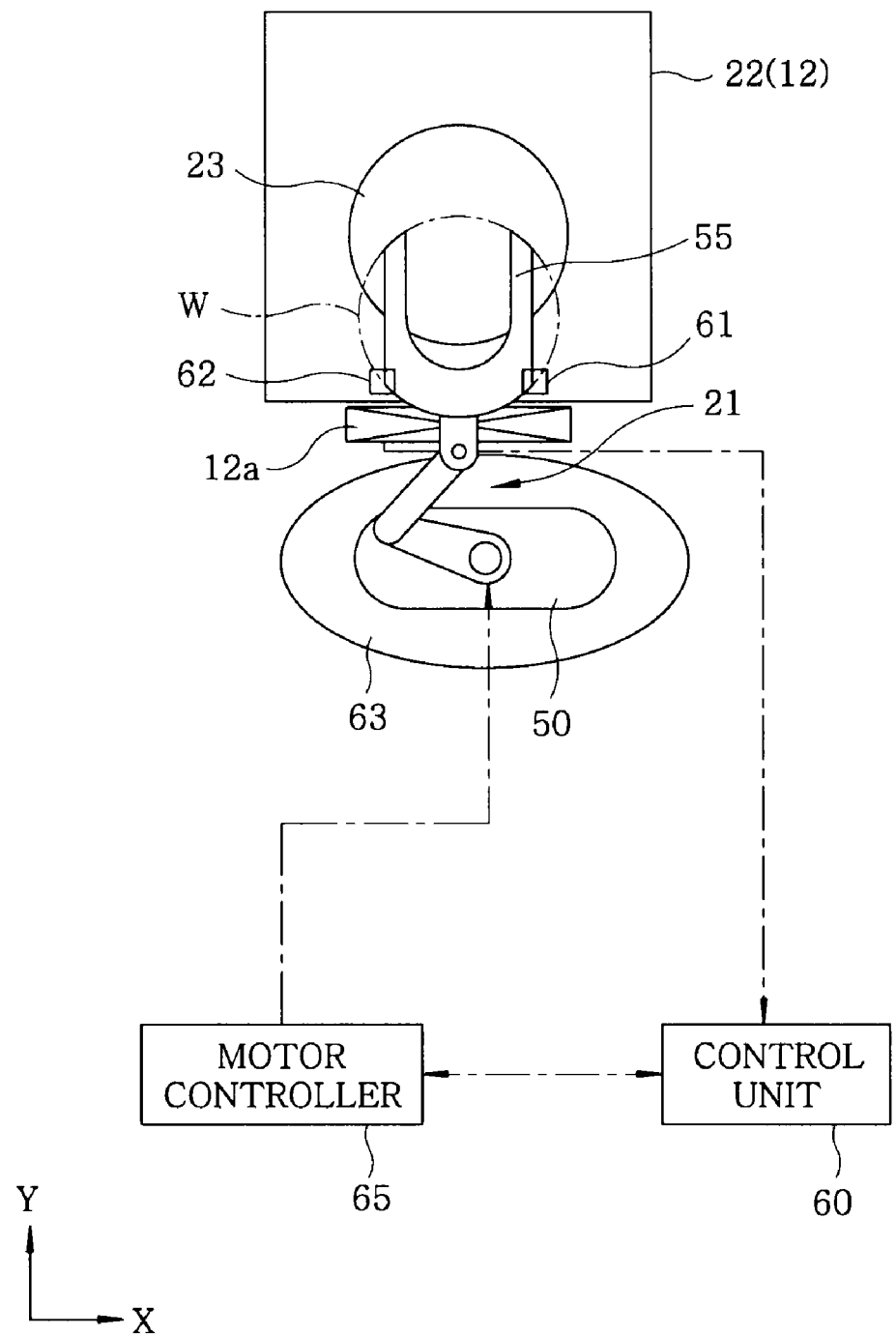
FIG. 5 is a plan view illustrating a position relationship between the transfer arm and the chamber of a first PM.

FIG. 5 is a plan view illustrating a position relationship between the transfer arm 21 and the chamber 22 of the PM 12.

Referring to FIG. 5, position detecting sensors 61 and 62 which detect the wafer W are provided at two opposing sides of a wafer transfer port of the chamber 22 to be perpendicular to a loading/unloading path of the wafer W. The distance between the sensors 61 and 62 is smaller than the diameter of the wafer W so that when the wafer W passes through the sensors 61 and 62, the sensors 61 and 62 can detect a misalignment of the wafer W from a proper position. The sensors 61 and 62 are, e.g., optical sensors and may be of a transmission type.

Each of the sensors 61 and 62 includes a light emitting part and a light receiving part arranged in a vertical direction, wherein light emitted from the light emitting part is received by the light receiving part. Using reflection type optical sensors in such configuration may result in poor sensitivity due to different reflection coefficients of films formed on the wafer W. Therefore, transmission type optical sensors may be advantageous used as the sensors 61 and 62, The sensors 62 and 61 detect values Ya and Yb (refer to FIG. 7 to be described later) indicating an amount of misalignment from the wafer W passing by and transmit the values Ya and Yb to a control unit (e.g., computer) 60. Based on the values Ya and Yb, the control unit 60 calculates the amount of misalignment from an appropriate position of the wafer W. Further, the control unit 60 transmits the calculated value to a motor controller 65, which corrects the misalignment by controlling the motor 52 and a moving motor (hereinafter, referred to as "X direction motor") that moves the position of the support base 50, e.g., the stage 63, in the direction of X shown in FIG. 5.

Hereinafter, a substrate transfer method in the substrate processing apparatus thus configured will be described in accordance with the embodiment of the present invention.

When the wafer W is loaded into the chamber 22 of the PM 12 shown in FIG. 1 to perform a predetermined treatment on the wafer W, the transfer arm 40 firstly accesses the FOUP 37 via the load port 41 provided at a boundary between the loader module 18 and the FOUP mounting table 38 to withdraw a sheet of the wafer W. The withdrawn wafer W is loaded into the orienter 39 to be pre-aligned, and then withdrawn again by the transfer arm 40 to be loaded into, e.g., the load lock module 19. There after, the transfer arm 40 accesses the mounting table 19c to mount the wafer W thereon.

Then, the gate valve 19b is closed and the interior of the load lock module 19 is depressurized by a vacuum pump (not shown). At this time, depressurization is conducted until the pressure in the load lock module 19 becomes identical to that of the interior of the transfer module 11 and that of the interior of the chamber 22 of the PM 12, for example, up to 20 Pa (0.15 Torr) to 1330 Pa (10 Torr).

When the pressure in the load lock module 19 reaches to a value within the range between 20 Pa and 1330 Pa, the gate valve 19a is opened and the wafer W mounted on the wafer mounting table 19c is withdrawn by the transfer arm 21 configured as the single-axis multi-joint robot to be loaded into the chamber 22 of the PM 12 (first processing unit).

Then, the wafer W is subjected to, e.g., an etching treatment in the PM 12. After the etching treatment, the gate valve 12a is opened and the transfer arm 21 is extended to access the chamber 22 of the PM 12 and then contracted to unload the wafer W. While unloading the wafer W, an amount of misalignment of the wafer W is detected by the sensors 61 and 62 respectively arranged at the left and the right half of the wafer transfer port (misalignment detection step), and misalignment correction (as will be described later) is performed based on the detected value (correction step).

The wafer W whose misalignment has been corrected is thereafter loaded into, e.g., the adjacent PM 13 (second processing unit) by extending the transfer arm 21 to perform a subsequent process, e.g., etching process. Thereafter, the wafer W that has been subjected to an etching process is unloaded from the PM 13 and loaded into, e.g., the PM 14 that performs a subsequent process, such as an ashing process. In the chamber of the PM 14, for example, the etched wafer W is subjected to an ashing process.

When the ashing process is finished in the PM 14, the gate valve 14a is opened and the transfer arm 21 accesses the chamber of the PM 14 to withdraw the wafer W. The withdrawn wafer W is loaded into the load lock module 19 and mounted on the wafer mounting table 19c.

After the wafer W is mounted on the mounting table 19c, the gate valve 19a is closed and the internal pressure of the load lock module 19 is increased slightly larger than the atmospheric pressure. Thereafter, the gate valve 19*b* is opened so that the load lock module 19 is opened to atmosphere. Accordingly, particles can be prevented from flowing into the load lock module 19.

Then, the wafer W is withdrawn from the mounting table 19*c* of the load lock module 19 by the transfer arm 40 in the loader module 18, and returned to the FOUP 37 of the FOUP mounting table 38, thus finishing the series of processes.

Hereinafter, a step of correcting the misalignment of the wafer W in the substrate transfer method in accordance with the embodiment of the present invention will be described in detail with reference to FIGS. 6 and 7.

Figure 6:
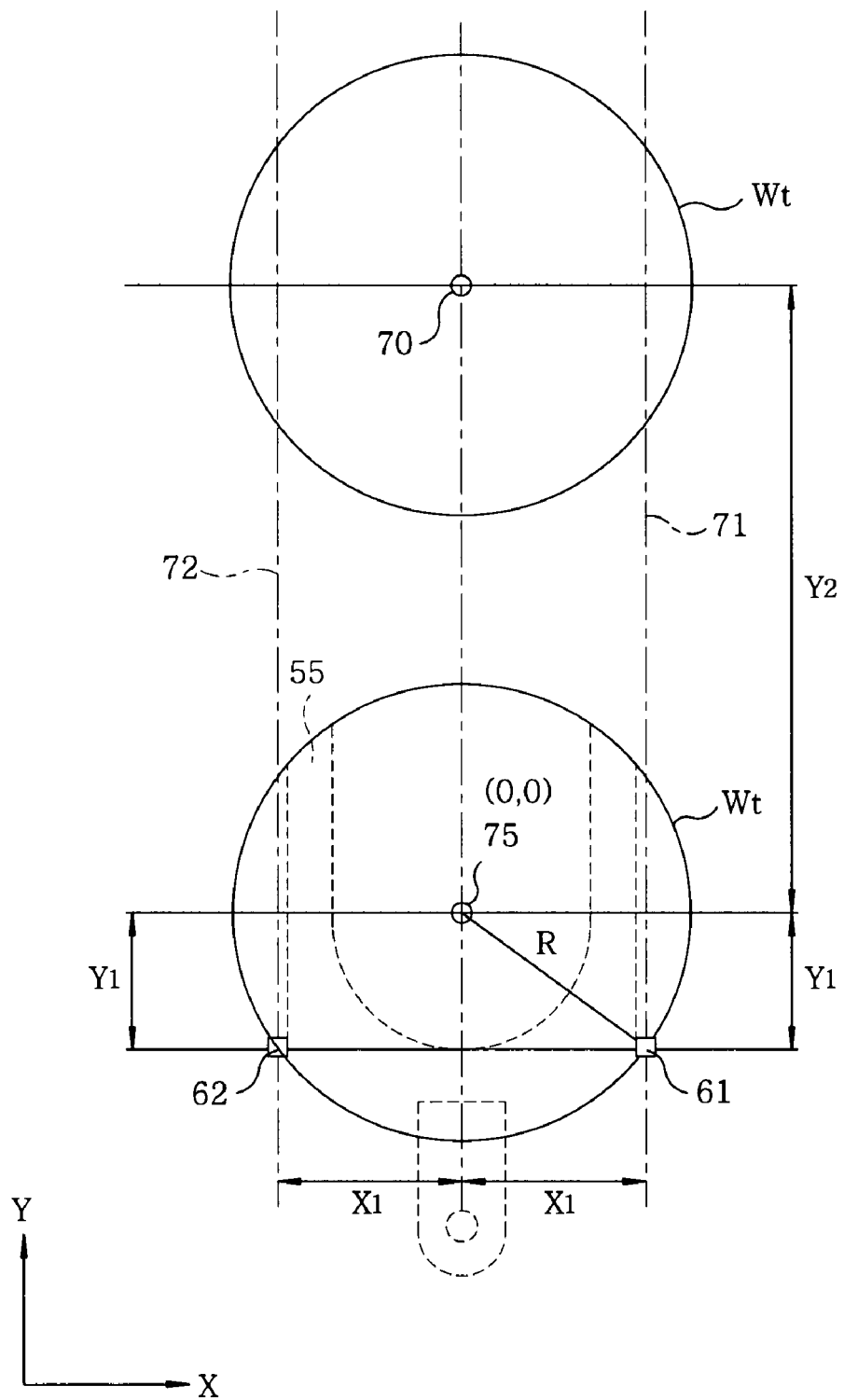
FIG. 6 is a plan view illustrating that a wafer is located at a proper position.
Figure 7:
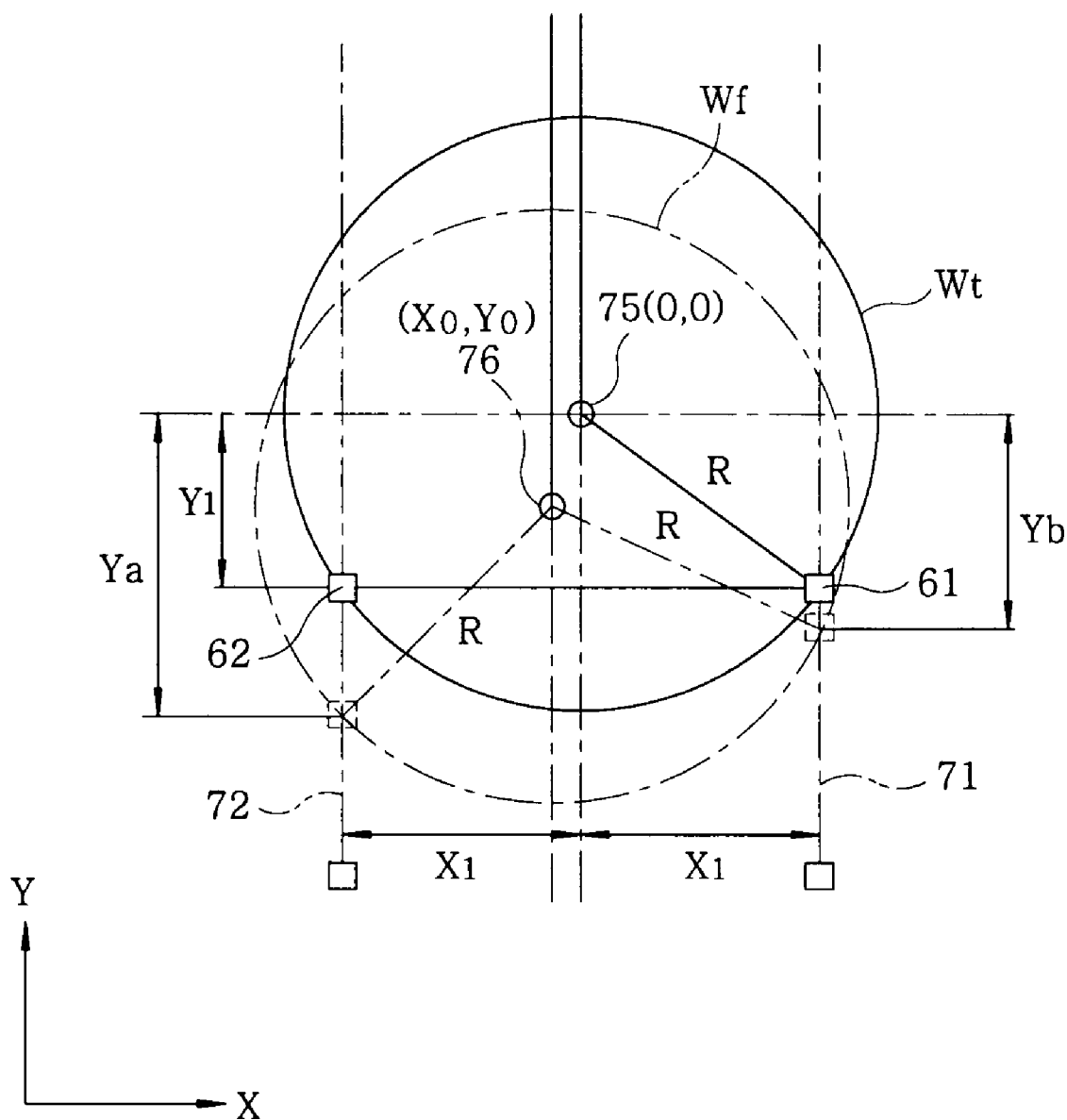
FIG. 7 is a plan view illustrating a relative relationship between a position where the wafer W is properly located and a position where the wafer W is misaligned.

FIG. 6 is a plan view illustrating the wafer W located at an appropriate position, and FIG. 7 is a plan view illustrating a relative relationship between a position where the wafer W is properly located and a position where the wafer W is misaligned.

Referring to FIGS. 6 and 7, a "proper wafer Wt" refers to the wafer W located at a proper position and indicated by the solid line, and a "proper center 75" refers to the center of the proper wafer Wt. A "misaligned wafer Wf" refers to the wafer W misaligned and indicated by the dashed line, and a "misaligned center 76" refers to the center of the misaligned wafer Wf. Lines 71 and 72 represent trajectories of the passing sensors 61 and 62 and their extensions, respectively. By setting the proper center 75 as the origin point (0, 0), a coordinate system is established to determine the absolute position of the wafer or wafer pick 55. This coordinate system is valid for the one fixedly installed in the PM 12, PM 13, or the like.

To begin with, a case will be described with reference to FIG. 6 where the wafer Wt is unloaded from the PM 12 while maintaining a proper position.

Referring to FIG. 6, the wafer Wt located at an upper side represents the wafer W placed in the chamber 22 of the PM 12, and the wafer Wt located at a lower side represents the wafer when the wafer is unloaded from the chamber 22 of the PM 12 and passes through the wafer transfer port. The reference numeral "70" refers to the center of the wafer Wt mounted on the mounting table 23 of the chamber 22. The wafer pick 55 holds the wafer Wt and moves the wafer Wt from the mounted position in the direction of Y (in the downward direction in FIG. 6). In FIG. 6, the wafer Wt located at a lower side is the one at the moment when the wafer Wt is detected by the sensors 61 and 62 arranged at the wafer transfer port of the chamber 22 of the PM 12.

As described above, the center of the wafer Wt when the wafer Wt is detected by the sensors 61 and 62 is represented by the proper center 75. A distance from the proper center 75 to each of the sensors 61 and 62 is represented by "Y1" when measured in the direction of Y, and "X1" when measured in the direction of X. For example, distance Y2 by which the wafer Wt is moved from the center 70 to the center 75 is predetermined, so that the distance Y2 may be calculated based on the number of rotation pulses of the motor 52 of the transfer arm 21.

The misaligned wafer will be described hereinafter with reference to FIG. 7. As mentioned above, the misaligned wafer is represented by the wafer Wf.

The transfer arm 21 unloads the misaligned wafer Wf that has been subjected to, e.g., an etching process from the PM 12 by the wafer picks 55. Upon unloading, the misaligned wafer Wf passes between a light receiving part (not shown) and a light emitting part (not shown) of each of the sensors 61 and 62. In case that the wafer Wf is misaligned as shown in FIG. 7, the sensor 62 first detects the wafer Wf and then the sensor 61 detects the wafer Wf. Ya and Yb refer to Y coordinates when the wafer Wf is detected by the sensors 62 and 61, respectively, with a temporal deviation.

As described above, the distance Y2 (refer to FIG. 6) and the number of rotation pulses corresponding to the distance Y2 are predetermined. Accordingly, values Ya and Yb can be calculated based on differences from the distance Y2 and the number of rotation pulses corresponding to the distance Y2 that are considered as references. More specifically, when the wafer Wf is misaligned as shown in FIG. 7, the sensor 62 detects the wafer Wf earlier than the reference (at a position where the number of rotation pulses is smaller than the reference) and the sensor 61 also detects the wafer Wf earlier than the reference (at a position where the number of rotation pulses is smaller than the reference).

The control unit 60 calculates the values Ya and Yb based on detected signals from the sensors 62 and 61, respectively. That is, the control unit 60 calculates a relative misalignment between the proper center 75 and the misaligned center 76 based on the values Ya and Yb.

That is, let the proper center 75 be the origin point (0,0) and 76 (X0, Y0) be the misaligned center, and the misaligned center 76 (X0, Y0) is calculated. Here, the misaligned center 76 (X0, Y0) of the misaligned wafer Wf can be calculated by setting the radius of the wafer W as R, and substituting the values Ya and Yb detected by the sensors 62 and 61 into the following Eqs. 1 and 2:

$$(X1+X0)^2+(Ya-Y0)^2=R^2 \qquad \text{Eq. 1, and}$$

$$(X1-X0)^2+(Yb-Y0)^2=R^2 \qquad \text{Eq. 2.}$$

Subsequently, the control unit 60 controls an X-direction motor (not shown) and the motor 52 via the motor controller 65 based on the X-axis direction misalignment X0 and the Y-axis direction misalignment Y0.

As to the X-axis direction misalignment X0, the X-direction motor moves the transfer arm 21 as much as −X0, and as to the Y-axis direction misalignment Y0, the motor 52 moves the wafer picks 55 as much as −Y0. As described, while the wafer W is unloaded from the chamber 22 of the PM 12, the wafer W is corrected to a proper position. Specifically, the correction of misalignment of the wafer W is performed, for example, while the wafer W is unloaded by the wafer picks 55 from the PM 12 and before the wafer picks 55 revolve to the travelling direction in order to move to the front of the chamber of the adjacent PM 13.

As described above, while the wafer W is unloaded from the PM 12, the misalignment of the wafer W is corrected. Thereafter, the wafer picks 55 of the transfer arm 21 is moved in the X direction up to a position corresponding to the chamber of the PM 13. Then, the wafer pick 55 is moved in the Y direction to load the wafer W into the chamber of the PM 13.

In accordance with the embodiment of the present invention, when the wafer W is transferred from the chamber of the PM 12 to the chamber of the PM 13, the misalignment of the wafer W is detected and corrected while the wafer W is unloaded from the chamber 22 of the PM 12 and then loaded into the chamber of the PM 13. Accordingly, the wafer W that has been subjected to the misalignment correction can be directly loaded to the targeted position. Consequently, such cumbrances in the prior art that the wafer W once transferred to a targeted position is subjected to its misalignment correction and then moved again to the targeted position may be alleviated. Further, the embodiment does not require a feedback control when the wafer W is loaded into the PM 13, thereby stabilizing the operation. Further, additional software or hardware generating additional pulses for feedback control is unnecessary.

Further, in accordance with the embodiment of the present invention, since the position misalignment detection step is performed by the sensors 61 and 62 provided at the wafer transfer port of the PM 12 which is the first processing unit, it is possible to secure a relatively long time for the misalignment correction to thereby achieve a stable misalignment correction operation.

Further, in accordance with the embodiment of the present invention, since the step of correcting the misalignment of the wafer W is performed while the transfer arm 21 is contracted and the step of loading the wafer W into the chamber of the PM 13 is performed while the transfer arm 21 is extended, there is no need of correcting misalignment under the situation where the transfer arm 21 is fully extended, thus facilitating an accurate misalignment correction.

In accordance with the embodiment of the present invention, since the transfer of the wafer W from the PM 12 to the PM 13 can be accurately performed while correcting the misalignment of the wafer W, various processes using a plasma, such as etching or the like can be accurately conducted on the wafer W. Further, the substrate transfer method in accordance with the embodiment of the present invention can be applied, by taking the load lock module 19 as the first processing unit and the PM 12 as the second processing unit, to transfer of the wafer W therebetween.

In the embodiment, when the wafer W is loaded into the chamber of the PM 12 via the load lock module 19, a position alignment is performed by the orienter 39 provided at the loader module 18, and when the wafer W is transferred from the chamber of the PM 12 to the chamber of the PM 13, a misalignment of the wafer W is detected by the sensors 61 and 62 when being unloaded from the chamber of the PM 12 and a misalignment correction is conducted based on the detected result. Accordingly, the wafer W can be sequentially loaded into each and every PM without any misalignment, thus making it possible to accurately and consecutively carry out a plurality of processes.

Although it has been exemplified in the embodiment that the sensors 61 and 62 provided at the wafer transfer port are disposed in the chamber 22 of the PM 12 (refer to FIG. 5), the sensors 61 and 62 may also be provided at corresponding positions inside the transfer module 11 which is connected via the chamber 22 and the gate valve 12a.

Although it has been exemplified in the embodiment that the transfer arm 21 is configured as a single-axis multi-joint robot of a single link type, a double-link type single-axis multi-joint robot may also be employed, for example.

Although there has been exemplified a cluster-type substrate processing apparatus including a plurality of PMs installed around the transfer module 11, the substrate transfer method in accordance with the embodiment of the present invention may also be applied to a substrate processing apparatus including a plurality of PMs arranged in parallel along two opposing sides of a transfer module, which has the same operation and effects.

Further, the substrate transferred by the substrate transfer method in accordance with the embodiment of the present invention is not limited to a wafer for semiconductor devices, but may include various substrates for LCDs (Liquid Crystal Displays), FPD (Flat Panel Displays), photomasks, CD substrates, PCBs (Printed Circuit Boards) or the like.

Moreover, the present invention can also be achieved by supplying a storage medium storing program codes of software for implementing the functions of the above-mentioned embodiments to a system or an equipment whose computer (or CPU or MPU) may read and execute the program codes stored in the storage medium.

In this case, the program codes themselves, which are read from the storage medium, realize the functions the above-described embodiment, and the program codes and the storage medium storing the program codes constitutes the present invention.

Further, the storage medium for supplying program codes may include, e.g., floppy disc (registered trademark); hard disc; magneto-optical disc; optical disc including CD-ROM, CD-R, CD-RW, DVD-ROM, DVD-RAM, DVD-RW, or DVD+RWs; magnetic tape, non-volatile memory card, and ROM. Further, the program codes may be downloaded through a network.

The present invention includes a case where the functions of the above-described embodiment is implemented by executing the program codes read by the computer, and a case where an OS (Operating System) operating in the computer executes a part or the entirety of actual process based on commands of the program codes and the functions of the embodiment is implemented by the execution of the process.

The program codes read from the storage medium may be recorded in a memory provided in a function extension board inserted in the computer or a function extension unit connected to the computer. The present invention also includes a case where a CPU provided in the extension board or the extension unit executes a part or the entirety of actual processes based on commands of the program codes and the functions of the above-described embodiment is implemented by the execution of the processes.

While the invention has been shown and described with respect to the embodiment, it will be understood by those skilled in the art that various changes and modifications may be made without departing from the scope of the invention as defined in the following claims.

What is claimed is:

1. A substrate transfer method for use in a substrate processing apparatus including a transfer unit having therein a substrate transfer mechanism, a first processing unit that is connected to a side surface of the transfer unit and performs a first process on a substrate, and a second processing unit that is connected to another side surface of the transfer unit and performs a second process on the substrate, the substrate transfer mechanism transferring the substrate between the first and the second processing unit, the method comprising:
   detecting misalignment of the substrate when the substrate is unloaded from the first processing unit;
   correcting the misalignment of the substrate based on a detected result; and
   loading the misalignment-corrected substrate to a targeted position in the second processing unit,
   wherein said detecting is performed by a position detecting sensor provided at a substrate transfer port of the first processing unit.

2. The substrate transfer method of claim 1, wherein the substrate transfer mechanism repeats a contracting operation and an extending operation to transfer the substrate, and wherein said correcting is performed while the substrate transfer mechanism performs the contracting operation and said loading is performed while the substrate transfer mechanism performs the extending operation.

3. The substrate transfer method of claim 1, wherein the substrate processing apparatus further includes a control unit that controls the substrate transfer mechanism, wherein the control unit corrects the misalignment of the substrate based on the detected result of the position detecting sensor.

4. The substrate transfer method of claim 1, wherein the first processing unit is a load lock module and the second processing unit is a processing module.

5. The substrate transfer method of claim 1, wherein each of the first and the second processing unit is a processing module.

6. A computer-readable storage medium storing a control program which instructs a processor of a computer to execute a substrate transfer method for use in a substrate processing apparatus including a transfer unit having therein a substrate transfer mechanism, a first processing unit that is connected to a side surface of the transfer unit and performs a first process on a substrate, and a second processing unit that is connected to another side surface of the transfer unit and performs a second process on the substrate, the substrate transfer mechanism transferring the substrate between the first processing unit and the second processing unit, the method comprising:

detecting misalignment of the substrate when the substrate is unloaded from the first processing unit;

correcting the misalignment of the substrate based on a detected result; and loading the misalignment-corrected substrate to a targeted position in the second processing unit, wherein said detecting is performed by a position detecting sensor provided at a substrate transfer port of the first processing unit.

\* \* \* \* \*